United States Patent
Kimura et al.

(10) Patent No.: US 6,815,142 B1
(45) Date of Patent: Nov. 9, 2004

(54) METHOD FOR FORMING RESIST PATTERN, AND OVERLYING LAYER MATERIAL AND SEMICONDUCTOR DEVICE USED FOR FORMING RESIST PATTERN

(75) Inventors: Yoshika Kimura, Tokyo (JP); Takeo Ishibashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 426 days.

(21) Appl. No.: 09/583,865

(22) Filed: May 31, 2000

(30) Foreign Application Priority Data

Dec. 28, 1999 (JP) ............................................ 11-372298

(51) Int. Cl.$^7$ ................................................. G03C 8/50
(52) U.S. Cl. ...................... 430/258; 430/259; 430/261; 430/271.1; 430/273.1; 430/320; 430/322; 430/328; 430/329; 430/350
(58) Field of Search ................................ 430/258, 259, 430/261, 271.1, 273.1, 320, 322, 328, 329, 350

(56) References Cited

U.S. PATENT DOCUMENTS

| | | | | |
|---|---|---|---|---|
| 5,514,520 A | * | 5/1996 | Thackeray et al. | 430/270.14 |
| 5,529,888 A | * | 6/1996 | Watanabe et al. | 430/331 |
| 5,650,261 A | * | 7/1997 | Winkle | 430/270.1 |
| 5,858,620 A | * | 1/1999 | Ishibashi et al. | 430/313 |
| 6,180,320 B1 | * | 1/2001 | Saito et al. | 430/203 |

FOREIGN PATENT DOCUMENTS

| | | | | |
|---|---|---|---|---|
| JP | 06118630 A | * | 4/1994 | ........... G03F/7/004 |
| JP | 6-266116 | | 9/1994 | |
| JP | 7-295228 | | 11/1995 | |
| JP | 8-292562 | | 11/1996 | |

OTHER PUBLICATIONS

Machine translation of the above cited Japanese reference.*

* cited by examiner

Primary Examiner—Yvette C. Thornton
(74) Attorney, Agent, or Firm—McDermott Will & Emery LLP

(57) ABSTRACT

A method for forming resist patterns, and an overlying layer material and a semiconductor device used in the method for forming resist patterns, which can improve the dimensional uniformity of resist patterns by inhibiting the multiple interference of light beams within a resist film; improve the environmental resistance in a clean room or the like; and obtain resist patterns having rectangular sectional shapes by preventing the acid in the overlying layer material from diffusing into the resist. By using an overlying layer material containing a water-soluble low-molecular-weight acidic substance and a water-soluble photo base generator preventing the diffusion of the acidic substance into the resist, the base formed after exposure neutralizes the acids contained in the overlying layer material in nature, and the diffusion of the acid into the resist can be inhibited. As a result, since the elimination group of the protective group of the polymer on the surface of the resist is inhibited, and the cross-linking reaction in the resist can be inhibited, resist patterns having rectangular sectional shapes can be obtained.

13 Claims, 4 Drawing Sheets

Fig. 1A
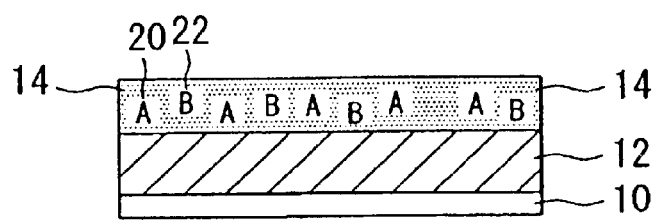
Fig. 1B
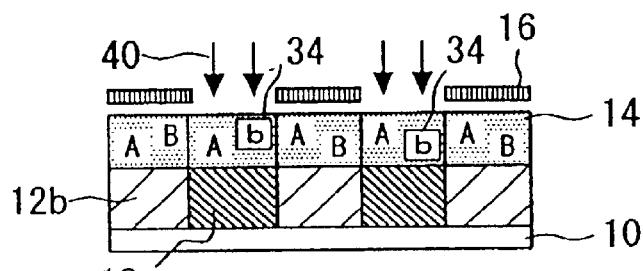
Fig. 1C
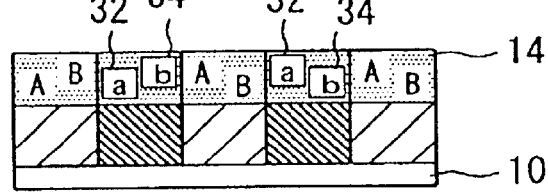
Fig. 1D
Fig. 1E
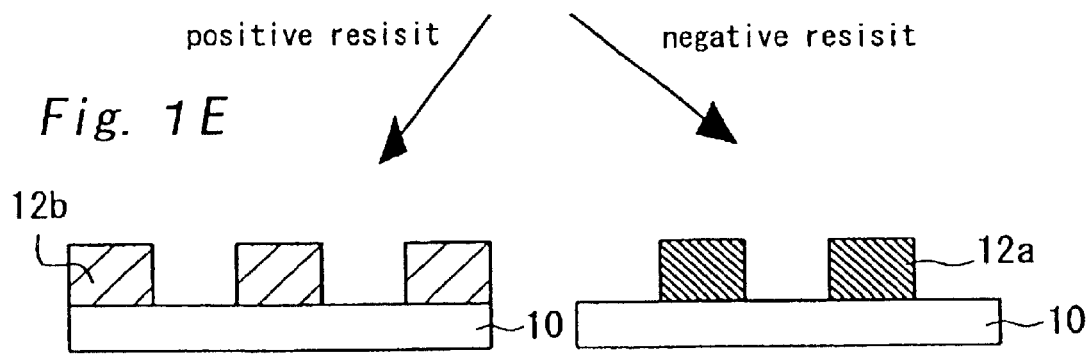

Fig. 2D1

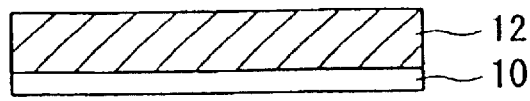
Fig. 3A
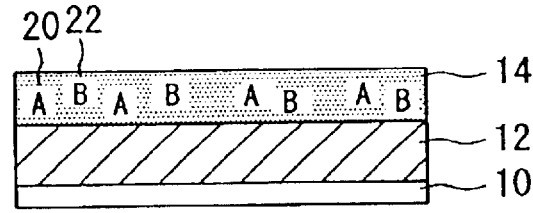
Fig. 3B
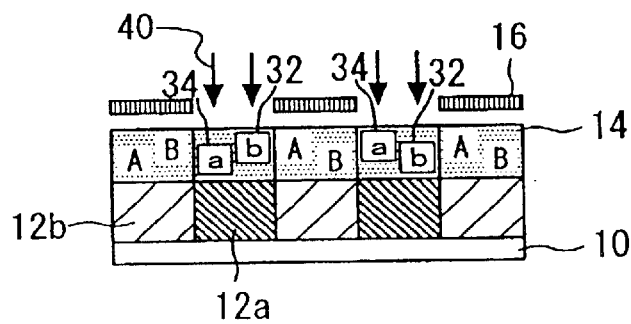
Fig. 3C
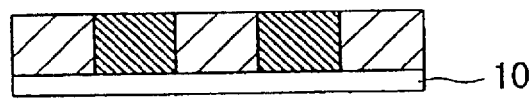
Fig. 3D2
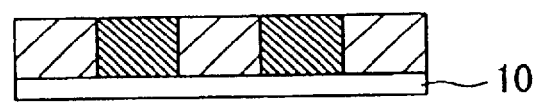
Fig. 3D3
Fig. 3E
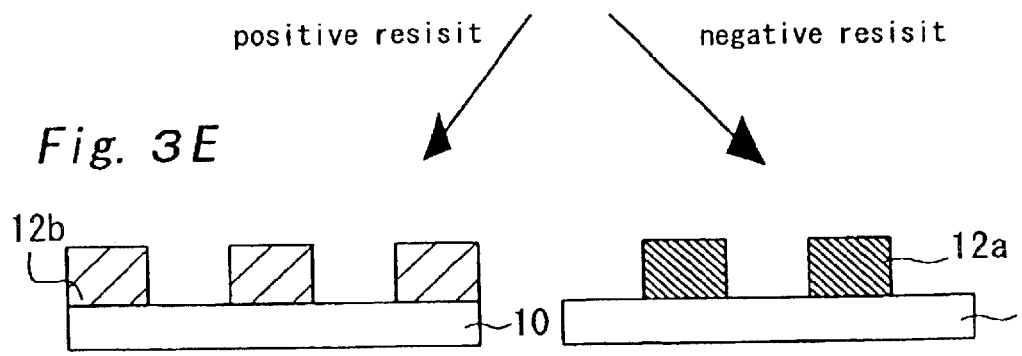

METHOD FOR FORMING RESIST PATTERN, AND OVERLYING LAYER MATERIAL AND SEMICONDUCTOR DEVICE USED FOR FORMING RESIST PATTERN

BACKGROUND OF THE INVENTION

1. Field of the Invention

The present invention relates to a method for forming a resist pattern, an overlying layer material and a semiconductor device used in a method for forming a resist pattern. More specifically, the present invention relates to a method for forming a resist pattern, where a process with a high level of environmental resistance has been established, and using an improved overlying layer material for obtaining a pattern having uniform and accurate dimensions, and having a high resolution; and to such an overlying layer material, and to such a semiconductor device.

2. Description of Related Art

In the excimer resist process using an excimer laser for exposure, chemical amplification type resists have been developed and manufactured as the mainstream for both positive and negative resists. These chemical amplification type resists are classified into two types: the type containing an acid forming agent, and the type containing a photo base generator. Either type of resists generates an acid or a base by exposure, and a catalyzed reaction occurs by heat treatment after exposure (post-exposure baking, PEB).

The type recently being developed is the type containing an acid forming agent. Generally in this type containing an acid forming agent, a positive resist comprises a base resin in which the polar group of an alkali-soluble resin is protected by a dissolution inhibiting group, and an acid forming agent; and a negative resist comprises a base resin, a cross-linking agent, and an acid forming agent. This resist containing an acid forming agent undergoes a reaction catalyzed by the acid formed by exposure. In case of the positive resist, the polymer protective group of the base resin is decomposed to be alkali-soluble for the developing solution, and in case of the negative resist, the cross-linking agent reacts with the polymer to increase the molecular weight, becoming insoluble in the developing solution. As a result, a resist pattern is formed. As described above, since the reaction is catalyzed by an acid, the reaction efficiency becomes high, and high sensitivity can be achieved. On the other hand, because of the high environment dependency of the clean room, if the time between exposure and PEB is long, the acid is deactivated by the effect of basic components of the air in the clean room, such as ammonia, raising a problem of the formation of less soluble surface layer in the positive resist. In order to solve this problem, the development of resist materials little affected by basic components of the air has been studied by making applying, exposing, and developing processes in-line.

Concurrent with the above-described development, the process in which an acidic overlying layer material is applied has also been studied for preventing the diffusion of basic components in the resist. The purpose of applying the overlying layer material also includes the improvement of dimensional accuracy. Since the multiple reflection of light beams occurs in the resist film, the dimension of the resist is varied if the thickness of the resist film is uneven. If the underlying layer has steps, the thickness of the resist film is varied, resulting in a significant change in the dimension of the resist pattern. Therefore, the development of the overlying layer material that can inhibit the multiple interference of light beams in the resist film has become essential.

FIGS. 4A through 4E show the process flow of resist pattern formation using a conventional overlying layer material. In FIGS. 4A through 4E, the numeral 10 is a substrate, 12 is a resist applied on the substrate 10, 40 is light beams for exposure, 12a is an exposed part exposed by light beams 40, 12b is an unexposed part not exposed by light beams 40, 14 is an overlying layer material applied on the resist 12, 20 is an acid A contained in the overlying layer material 14, 16 is a mask, and 17 and 18 are film edges formed on the surface of the resist 12.

Referring to FIG. 4A, a resist 12 is applied on a substrate 10, and subjected to a pre-baking treatment. Next, as FIG. 4B shows, an overlying layer material 14 is applied on the resist 12, and subjected to a re-baking treatment. As FIG. 4C shows, light beams 40 are radiated onto the resist 12 through a mask 16, and as FIG. 4D shows, a heat treatment (PEB) after exposure is performed. Finally, by developing the resist 12, resist patterns shown in the left of FIG. 4E are formed in case of the positive resist, and resist patterns shown in the right of FIG. 4E are formed in case of the negative resist.

In order to apply the above-described resist pattern forming process using the conventional overlying layer material to a presently mainstream chemical amplification type resist containing an acid forming agent, the basic components in the air must be trapped. Therefore, the overlying layer material is typically an acidic film. As a result, in case of a positive resist, acid A (20) in the overlying layer material 14 is diffused into the unexposed part 12b of the resist 12 during the PEB treatment after exposure, raising the problems of the formation of film edges 17 on the surface of the unexposed part 12b of the resist 12 caused by the polymer elimination reaction, and the deterioration of the resist patterns. In case of a negative resist, acid A (20) in the overlying layer material 14 is diffused into the unexposed part 12b of the resist 12, a cross-linking reaction occurs also in the unexposed part 12b, and a surface layer difficult to dissolve is formed as shown by the film edges 18, raising a problem that the desired resist pattern cannot be obtained. When this phenomenon is significant, there is a problem that the surface of the resist becomes entirely insoluble. Furthermore, in case of a negative resist, there is a problem that an acidic overlying layer material 14 containing an acid A (20) does not match with the resist 12, and the pattern is degraded or is not resolved.

SUMMARY OF THE INVENTION

The object of the present invention is to solve the above problems, and to provide a method for forming resist patterns, an overlying layer material and a semiconductor device used in the method for forming resist patterns, which can inhibit the multiple interference of light beams within a resist film and the uniformity of the dimensions of the resist patterns can be improved, even if the underlying layer has steps and the thickness of the resist film is varied.

Another object of the present invention is to provide a method for forming resist patterns, an overlying layer material and a semiconductor device used in the method for forming resist patterns, which can avoid the effect of basic components such as ammonia in the air in a clean room or the like in applying, exposing, and developing processes, and can inhibit the diffusion of basic components into the resist and improve the environmental resistance of the resist.

A further object of the present invention is to provide a method for forming resist patterns, an overlying layer material and a semiconductor device used in the method for forming resist patterns, which can prevent the diffusion of acids in the overlying layer material into the resist and can obtain resist patterns having rectangular sectional shapes.

According to a first aspect of the present invention, there is provided a method for forming a resist pattern, comprising the steps of: pre-baking a semiconductor substrate on the surface of which a resist has been applied; re-baking the semiconductor substrate, forming a film on the resist using an overlying layer material containing a water-soluble acid substance and a water-soluble photo base generator; post-baking the semiconductor substrate after exposing the overlying layer material to light beams; and forming a resist pattern, developing the resist using a predetermined developing solution and peeling off the overlying layer material together with the developing solution.

According to a second aspect of the present invention, there is provided a n overlying layer material used in a method for forming a resist pattern by pre-baking a semiconductor substrate on the surface of which a resist has been applied; forming a film on the resist using a predetermined overlying layer material, and re-baking the semiconductor substrate; after exposing the predetermined overlying layer material to light beams, post-baking the semiconductor substrate; and developing the resist using a predetermined developing solution, and peeling off the overlying layer material together with the developing solution, wherein the overlying layer material contains a water-soluble acid substance and a water-soluble photo base generator.

According to a third aspect of the present invention, there is provided a semiconductor device used in a method for forming a resist pattern comprising: a semiconductor substrate; a resist applied to the semiconductor substrate; and a film formed on the resist using an overlying layer material containing a water-soluble acid substance and a water-soluble photo base generator.

The above and other objects, effects, features and advantages of the present invention will become more apparent from the following description of the embodiments thereof taken in conjunction with the accompanying drawings.

BRIEF DESCRIPTION OF THE DRAWINGS

FIGS. 1A through 1E show the method of resist pattern formation according to a embodiment 1 of the present invention.

FIGS. 2A through 2D, 2D1 and 2E show the method for forming resist patterns according to the embodiment 3 of the present invention.

FIGS. 3A through 3C, 3D2, 3D3 and 3E show the method for forming resist patterns according to the embodiment 4 of the present invention.

Embodiments of the present invention will be described below with reference to the accompanying drawings. It is noted that the same reference symbols in the drawings denote the same or corresponding components.

DETAILED DESCRIPTION OF THE PREFERRED EMBODIMENTS

Embodiment 1

Figure 2A:
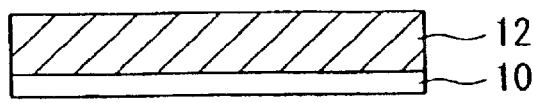
Figure 2B:
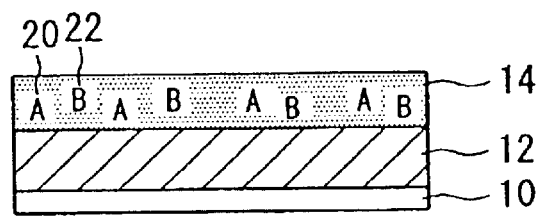
Figure 2C:
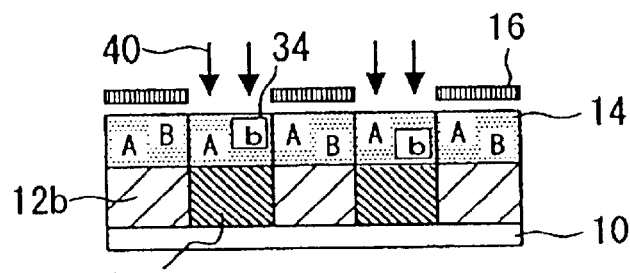

The overlying layer material of the present invention contains a water-soluble low-molecular-weight acidic substance so as to inhibit the diffusion of basic components in the air of a clean room or the like, such as ammonia, into the resist and improve the environmental resistance, by eliminating the effect of the basic components. Furthermore, in order to prevent the diffusion of such an acidic substance into the resist, the overlying layer material of the present invention contains a water-soluble photo base generator. This photo base generator is a substance that forms a base by the radiation of ultraviolet rays, electron beams, or the like, or by heating. The base formed from the photo base generator may be either organic or inorganic. By the use of this photo base generator, since the base formed by exposure neutralizes the acid contained in the overlying layer material in nature, a resist patterns having rectangular sectional shapes can be obtained from both positive and negative resists.

Next, there is described a method for forming resist patterns by using an excimer resist on which the above-described overlying material is applied. A uniform film can be formed by applying the above-described overlying layer material on the resist using well-known methods such as spin coating. This process for applying the overlying layer material can be used for both positive and negative resists.

FIGS. 1A through 1E show the method of resist pattern formation according to a embodiment 1 of the present invention. In FIGS. 1A through 1E, the numeral 10 is a substrate, 12 is a resist applied on the substrate 10, 40 is light beams for exposure, 12a is an exposed part of the resist 12 exposed by light beams 40, 12b is an unexposed part of the resist 12 not exposed by light beams 40, 14 is an overlying layer material of the present invention having the above-described features applied on the resist 12, 20 is an acid A contained in the overlying layer material 14, 22 is a photo base generator B contained in the overlying layer material 14 before exposure (see FIG. 1B) or the unexposed part of the overlying layer material 14 (see FIG. 1C), 32 is a neutralized acid a contained in the unexposed part of the overlying layer material 14 (see FIG. 1D), and 34 is a base b contained in the exposed part of the overlying layer material 14.

The case where the resist pattern forming method of the present invention is applied to a positive resist will be described. Referring to FIG. 1A, a resist 12 is applied on a substrate 10, and, subjected to a pre-baking treatment. Next, as FIG. 1B shows, an overlying layer material 14 of the present invention is applied on the resist 12 by way of a spin application to form a film, and subjected to a re-baking treatment. The overlying layer material 14 of the present invention contains an acid A and a photo base generator B. As FIG. 1C shows, light beams 40 are radiated onto the resist 12 through a desired mask 16, and as FIG. 1D shows, a heat treatment (PEB) after exposure is performed. By exposure, a base b (34) is formed from the photo base generator B (22) contained in the overlying layer material 14. The formed base b (34) is diffused into the overlying layer material 14 during the heat treatment (PEB), and neutralizes the acid A (20) contained in the overlying layer material 14. As a result, since the diffusion of the acid A (20) into the resist 12a is inhibited, the elimination reaction of the protective group of the polymer on the surface of the resist 12a is inhibited. Finally, in case of a positive resist, by developing the resist using 2.38% by weight of TMAH, resist patterns having rectangular sectional shapes is formed as shown in the left of FIG. 1E. Since the elimination reaction of the protective group of the polymer is inhibited as described above, the phenomenon in which the film thickness of the resist 12b is decreased after development, or the top of the resist is deformed can be inhibited, and patterns having rectangular sectional shapes can be formed.

As FIGS. 1D and 1E show, since the overlying layer material 14 and the developing solution can be peeled off simultaneously in the embodiment 1 of the present invention, the throughput can be improved.

According to the embodiment 1 as described above, since a base formed after exposure neutralizes the acid contained in the overlying layer material 14 in nature, and inhibits the diffusion of the acidic substance into the resist 12a by the use of the overlying layer material containing a water-soluble low-molecular-weight acidic substance, and a water-soluble photo base generator inhibiting the diffusion of the acidic substance into the resist, the elimination reaction of the protective group of the polymer on the surface of the resist 12a is prevented. As a result, in case of a positive resist, resist patterns having rectangular sectional shapes can be obtained.

Embodiment 2

In the above-described embodiment 1, the case where the method for forming resist patterns of the present invention is applied to a positive resist is described. In a embodiment 2, the case where the same method is applied to a negative resist will be described.

The case where the method for forming resist patterns of the present invention is applied to a negative resist will be described below referring to FIG. 1 as in the embodiment 1. The description of FIGS. 1A and 1B is omitted because these are the same as in case of a positive resist. As FIG. 1C shows, light beams 40 are radiated onto the resist 12 through a desired mask 16, and as FIG. 1D shows, a heat treatment (PEB) after exposure is performed. By exposure, a base b (34) is formed from the photo base generator B (22) contained in the overlying layer material 14. The formed base b (34) is diffused into the overlying layer material 14 during the heat treatment (PEB), and neutralizes the acid A (20) contained in the overlying layer material 14. As a result, since the diffusion of the acid A (20) into the resist 12b is inhibited, the cross-linking reaction in the resist 12b is inhibited. Finally, in case of a negative resist, by developing the resist using 2.38% by weight of TMAH, resist patterns having rectangular sectional shapes is formed as shown in the right of FIG. 1E, and resolution is improved.

In case of a negative resist, although there was a problem in which the acidic overlying layer material 14 containing an acid A (20) was not matched with the resist 12 causing the deterioration of the patterns, or patterns were not resolved at all as described above, the overlying layer material can be used for general purposes and the dimensional accuracy can be improved by the use of the overlying layer material 14 of the present invention.

According to the embodiment 2 as described above, since a base formed after exposure neutralizes the acid contained in the overlying layer material 14 in nature, and inhibits the diffusion of the acidic substance into the resist 12b by the use of the overlying layer material containing a water-soluble low-molecular-weight acidic substance, and a water-soluble photo base generator inhibiting the diffusion of the acidic substance into the resist, the cross-linking in the resist 12b is prevented. As a result, in case of a negative resist, resist patterns having rectangular sectional shapes can be obtained.

Embodiment 3

A embodiment 3 is a partially modified method for forming resist patterns of the above-described embodiment 1 and embodiment 2. FIGS. 2A through 2D and 2D1 show the method for forming resist patterns according to the embodiment 3 of the present invention. In FIGS. 2A through 2D and 2D1, parts carrying the same symbols as in FIGS. 1A through 1D are the same as in FIGS. 1A through 1D, and the description of these parts is omitted. Since FIGS. 2A through 2D are the same as FIGS. 1A through 1D, description for FIGS. 2A through 2D is omitted.

Figure 2D:
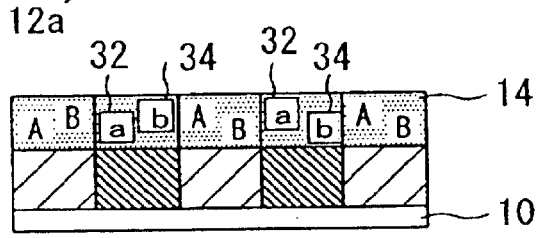
Figure 2D:
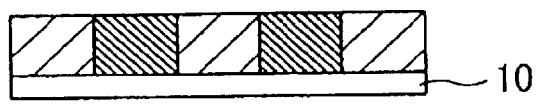
Figure 2E:
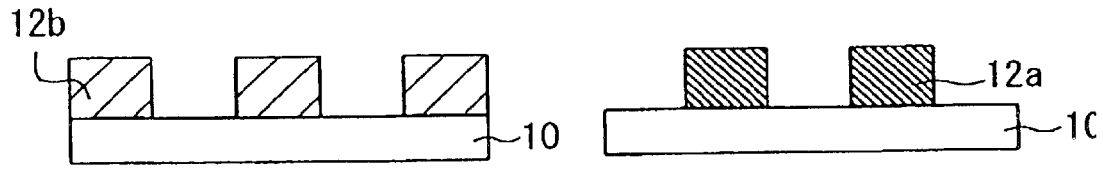
Figure 4A:
FIGS. 4A through 4E show the process flow of resist pattern formation using a conventional overlying layer material.
Figure 4B:
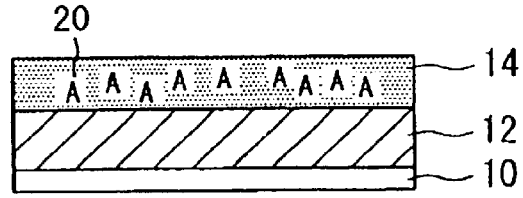
Figure 4C:
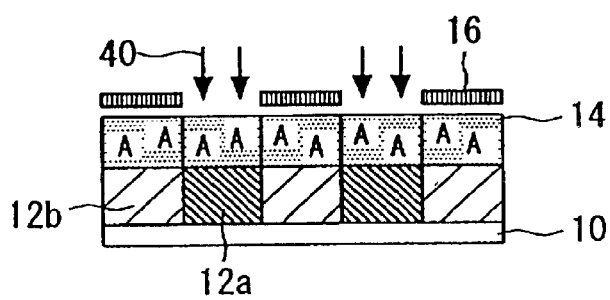
Figure 4D:
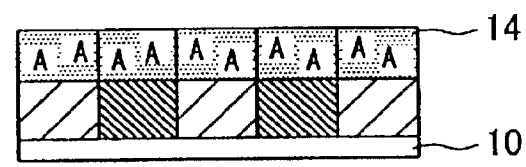
Figure 4E:
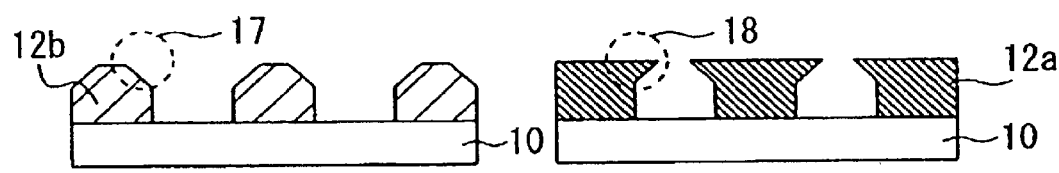

In the embodiment 3, after the PEB treatment after exposure shown in FIG. 2D, the overlying layer material 14 is washed with water, and peeled off as shown in FIG. 2D1. After this, the resist is developed by 2.38% by weight of TMAH to form resist patterns having rectangular sectional shapes as the left of FIG. 2E shows for the positive resist and the right of FIG. 2E shows for the negative resist.

According to the embodiment 3 as described above, by washing and peeling off the overlying layer material 14 after the PEB treatment after exposure, resist patterns having rectangular sectional shapes can also be formed as in the above-described embodiment 1 or embodiment 2. In addition, since the wetting properties of the developing solution is improved, the dimensional uniformity within the wafer surface can be improved.

Embodiment 4

An embodiment 4 is a partially modified method for forming resist patterns of the above-described embodiment 1 through embodiment 3. FIGS. 3A through 3C, 3D2 and 3D3 show the method for forming resist patterns according to the embodiment of 4 of the present invention. In FIGS. 3A through 3C, 3D2 and 3D3, parts carrying the same symbols as in FIGS. 1A through 1D are the same as in FIGS. 1A through 1D, and the description of these parts is omitted. Since FIGS. 3A through 3C are the same as FIGS. 1A through 1C, description for FIGS. 3A through 3C is omitted.

In the embodiment 4, after exposure shown in FIG. 3C, the overlying layer material 14 is washed with water, and peeled off as FIG. 3D2 shows. After this, the PEB treatment is performed as FIG. 3D3 shows. Finally, the resist is developed by 2.38% by weight of TMAH to form resist patterns having rectangular sectional shapes as the left of FIG. 3E shows for the positive resist and the right of FIG. 3E shows for the negative resist. In the embodiment 4, even if the PEB temperature is high when the resist 12 is subjected to the PEB treatment, and the mixing reaction occurs between the overlying layer material 14 and the resist 12 causing the deterioration of patterns, or residues are produced causing the defects of patterns, such problems can be solved because the overlying layer material 14 has been peeled off as shown in FIG. 3D2 before the PEB treatment shown in FIG. 3D3.

According to the embodiment 4 as described above, by peeling off the overlying layer material 14 before the PEB treatment, resist patterns having rectangular sectional shapes can also be formed as in the above-described embodiment 1 or embodiment 2. In addition, even if the PEB temperature is high when the resist 12 is subjected to the PEB treatment, and the mixing reaction occurs between the overlying layer material 14 and the resist 12 causing the deterioration of patterns, such problems can be solved.

Embodiment 5

The above is the description of several methods for forming resist patterns using an excimer resist on which the overlying layer materials of the present invention is applied. Finally, the specific example of these overlying layer materials, that is, the water-soluble acid overlying layer materials containing photo base generators will be described.

The overlying layer materials used in the method for forming resist patterns of the present invention are water-soluble acid overlying layer materials containing photo base generators. As the components for forming the water soluble films of the overlying layer materials of the present invention, a cellulose polymer, an acrylic polymer formed from acrylic acid monomers, or a vinyl polymer can be used. Examples of cellulose polymers include hydroxypropylmethyl cellulose phthalate, hydroxypropylmethyl cellulose acetate phthalate, hydroxypropylmethyl cellulose acetate succinate, hydroxypropylmethyl cellulose hexahydrophthalate, hydroxypropylmethyl cellulose, hydroxypropyl cellulose, hydroxypropylethyl cellulose, cellulose acetate hexahydrophthalate, carboxymethyl cellulose, ethyl cellulose, and methyl cellulose.

Examples of acrylic polymers include acrylic polymers formed of acrylic monomers such as N,N-dimethylacrylamide, N,N-dimethylaminopropyl methacrylamide, N-methyl methacrylamide, diacetone acrylamide, N,N-dimethylaminoethyl methacrylate, and N,N-dimethylaminoethyl acrylate.

Examples of vinyl polymers include PVA (polyvinyl alcohol), and PVP (polyvinyl pyrrolidone). As the components forming the water-soluble film of the overlying layer material of the present invention, acrylic polymers or vinyl polymers are preferable. These polymers may be used by mixing monomers, or may be used in combination of 2 or more components. The ammonium salt of a sulfonic acid is added to these components as an acidic low-molecular-weight agent.

As the photo base generator on the water-soluble film of the overlying layer material of the present invention, a transition metal complex, a benzyl carbamate compound, or an oxime compound can be used. The specific examples of photo base generators of water-soluble films used in the overlying layer of the present invention include hexaammonium cobalt perchlorate, hexapropylamine cobalt perchlorate, hexamethylamine cobalt perchlorate, bromopentapropylamine cobalt perchlorate, bromopentamethylamine cobalt perchlorate, [[(2-nitrobenzyl)oxy]carbonyl]methylamine, [[(2-nitrobenzyl)oxy]carbonyl]ethylamine, [[(2-nitrobenzyl)oxy]carbonyl][[(2-nitrobenzyl)oxy]carbonyl]hexylamine, [[(2-nitrobenzyl)oxy]carbonyl]cyclohexylamine, [[(2-nitrobenzyl)oxy]carbonyl]aniline, [[(2-nitrobenzyl)oxy]carbonyl]piperidine, bis[[(2-nitrobenzyl)oxy]carbonyl]hexamethylenediamine, bis[[(2-nitrobenzyl)oxy]carbonyl]phenylenediamine, bis[[(2-nitrobenzyl)oxy]carbonyl]toluenediamine, bis[[(2-nitrobenzyl)oxy]carbonyl]diaminodiphenylmethane, bis[[(2-nitrobenzyl)oxy]carbonyl]piperazine, [[(2,6-dinitrobenzyl)oxy]carbonyl]ethylamine, [[2,6-dinitrobenzyl)oxy]carbonyl]propylamine, [[(2,6-dinitrobenzyl)oxy]carbonyl]hexylamine, [[(2,6-dinitrobenzyl)oxy]carbonyl]cyclohexylamine, [[(2,6-dinitrobenzyl)oxy]carbonyl]aniline, [[(2,6-dinitrobenzyl)oxy]carbonyl]piperidine, bis[[(2,6-dinitrobenzyl)oxy]carbonyl]hexamethylenediamine, bis[[(2,6-dinitrobenzyl)oxy]carbonyl]phenylenediamine, bis[[(2,6-dinitrobenzyl)oxy]carbonyl]hexamethylenediamine, bis[[(2,6-dinitrobenzyl)oxy]carbonyl]toluenediamine, bis[[(2,6-dinitrobenzyl)oxy]carbonyl]diaminophenylmethane, bis[[(2,6-dinitrobenzyl)oxy]carbonyl]piperazine, [[(α,α-dimethyl-3,5-dimethoxybenzyl)oxy]carbonyl]methylamine, [[(α,α-dimethyl-3,5-dimethoxybenzyl)oxy]carbonyl]ethylamine, [[(α,α-dimethyl-3,5-dimethoxybenzyl)oxy]carbonyl]propylamine, [[(α,α-dimethyl-3,5-dimethoxybenzyl)oxy]carbonyl]hexylamine, [[(α,α-dimethyl-3,5-dimethoxybenzyl)oxy]carbonyl]cyclohexylamine, [[(α,α-dimethyl-3,5-dimethoxybenzyl)oxy]carbonyl]aniline, [[(α,α-dimethyl-3,5-dimethoxybenzyl)oxy]carbonyl]piperidine, bis[[(α,α-dimethyl-3,5-dimethoxybenzyl)oxy]carbonyl]hexamethylenediamine, bis[[(α,α-dimethyl-3,5-dimethoxybenzyl)oxy]carbonyl]phenylenediamine, bis[[(α,α-dimethyl-3,5-dimethoxybenzyl)oxy]carbonyl]diaminodiphenylmethane, bis[[(α,α-dimethyl-3,5-dimethoxybenzyl)oxy]carbonyl]toluenediamine, bis[[(α,α-dimethyl-3,5-dimethoxybenzyl)oxy]carbonyl]piperadine, propionyl acetophenone oxime, propionyl benzophenone oxime, propionyl acetone oxime, butyryl acetophenone oxime, butyryl benzophenone oxime, butyryl acetone oxime, adipoyl acetophenone oxime, adipoyl benzophenone oxime, adipoyl acetone oxime, acroyl acetophenone oxime, acroyl benzophenone oxime, and acroyl acetone oxime. These can be used alone, or in combination of two or more compounds. The amount of the photo base generator is preferably 0.01 to 50 wt % by weight of the resin component. If the amount exceeds 50 wt % by weight, the storage stability tends to decrease.

According to the embodiment 5 as described above, a cellulose polymer, an acrylic polymer formed from acrylic acid monomers, or a vinyl polymer can be used as the components for forming the water soluble films of the overlying layer materials of the present invention. Acrylic polymers or vinyl polymers are preferable. These polymers may be used by mixing monomers, or may be used in combination of 2 or more components. As the photo base generator on the water-soluble film of the overlying layer material of the present invention, a transition metal complex, a benzyl carbamate compound, or an oxime compound can be used. These can be used alone, or in combination of two or more compounds. The amount of the photo base generator is preferably 0.01 to 50 wt % by weight of the resin component.

The semiconductor device used in the above-described method for forming resist patterns of the present invention comprises a semiconductor substrate 10, a resist 12 applied on the semiconductor substrate 10, and an overlying layer material 14 containing a water-soluble acidic substance and a water-soluble photo base generator applied on the resist 12. Here, as the components forming a water-soluble film of the overlying layer material 14, an acrylic polymer or a vinyl polymer can be used alone, or in combination of two or more polymers. The acidic substance contained in the overlying layer material 14 may be the ammonium salt of a sulfonic acid. The water-soluble photo base generator contained in the overlying layer material 14 may be a transition metal complex, benzyl carbamete compound or an oxime compound. As described above, the resist 12 may be a positive resist or a negative resist.

According to the method for forming resist patterns, and the overlying layer material and the semiconductor device used in the method for forming resist patterns, as described above, the multiple interference of light beams within the resist film can be inhibited by the use of a water-soluble acidic overlying layer material containing a photo base generator, even in the case where the underlying layers have steps and the thickness of the resist film is varied, and a method for forming resist patterns, and the overlying layer material and the semiconductor device used in the method for forming resist patterns, which can improve the dimensional uniformity of the resist patterns, can be provided.

By incorporating a water-soluble low-molecular-weight acidic substance that can improve the environmental resistance in the overlying layer material, a method for forming resist patterns, and the overlying layer material and the semiconductor device used in the method for forming resist patterns, which can eliminate the effect of basic components such as ammonia in the air of a clean room or the like in applying, exposing, and developing processes, inhibit the diffusion of the basic components into the resist, and improve environmental resistance, can be provided.

Furthermore, by incorporating a water-soluble photo base generator that prevents the diffusion of acidic substances into the resist in the overlying layer material, a method for forming resist patterns, and the overlying layer material and the semiconductor device used in the method for forming resist patterns, which can prevent the acid in the overlying layer material from diffusing into the resist, and can form resist patterns having rectangular sectional shapes, can be provided.

In the method for forming a resist pattern, the step of forming a resist pattern may comprise the steps of peeling off the overlying layer material by washing with water; and developing the resist using a predetermined developing solution.

In the method for forming a resist pattern, the step of post-baking may comprise the steps of: peeling off the overlying layer material by washing with water after exposing the overlying layer material to light beams; and post-baking the resist; wherein the step of forming a resist pattern develops the resist using a predetermined developing solution.

In the method for forming a resist pattern, the overlying layer material may use an acrylic polymer or a vinyl polymer as the components forming a water-soluble film by alone or in combination of two or more components.

In the method for forming a resist pattern, the acid substance contained in the overlying layer material may be an ammonium salt of a sulfonic acid.

In the method for forming a resist pattern, the water-soluble photo base generator contained in the overlying layer material may be a transition metal complex, a benzyl carbamate compound, or an oxime compound.

In the method for forming a resist pattern, the resist may be a positive resist.

In the method for forming a resist pattern, the resist may be a negative resist.

In the overlying layer material used in a method for forming a resist pattern, the overlying layer material may use an acrylic polymer or a vinyl polymer as the components forming a water-soluble film by alone or in combination of two or more components.

In the overlying layer material used in a method for forming a resist pattern, the acid substance contained in the overlying layer material may be an ammonium salt of a sulfonic acid.

In the overlying layer material used in a method for forming a resist pattern, the water-soluble photo base generator contained in the overlying layer material may be a transition metal complex, a benzyl carbamate compound, or an oxime compound.

In the semiconductor device used in a method for forming a resist pattern, the overlying layer material may use an acrylic polymer or a vinyl polymer as the components forming a water-soluble film by alone or in combination of two or more components.

In the semiconductor device used in a method for forming a resist pattern, the acid substance contained in the overlying layer material may be an ammonium salt of a sulfonic acid.

In the semiconductor device used in a method for forming a resist pattern, the water-soluble photo base generator contained in the overlying layer material may be a transition metal complex, a benzyl carbamate compound, or an oxime compound.

In the semiconductor device used in a method for forming a resist pattern, the resist may be a positive resist.

In the semiconductor device used in a method for forming a resist pattern, the resist may be a negative resist.

The present invention has been described in detail with respect to various embodiments, and it will now be apparent from the foregoing to those skilled in the art that changes and modifications may be made without departing from the, invention in its broader aspects, and it is the invention, therefore, in the appended claims to cover all such changes and modifications as fall within the true spirit of the invention.

The entire disclosure of Japanese Patent Application No. 11-372298 filed on Dec. 28, 1999 including specification, claims, drawings and summary are incorporated herein by reference in its entirety.

What is claimed is:

1. A method for forming a resist pattern, comprising the steps of:
    pre-baking a semiconductor substrate having a surface to which a resist has been applied;
    forming a film on said resist comprising an overlying layer material containing a water-soluble acid substance and a water-soluble photo base generator
    re-baking said semiconductor substrate;
    exposing said overlying layer material and resist to light beams to form a resist pattern;
    post-baking said semiconductor substrate;
    developing said resist using a predetermined developing solution; and
    removing said overlying layer material together with said developing solution.

2. The method for forming a resist pattern according to claim 1, wherein said step of removing said overlying layer material is by washing with water.

3. The method for forming a resist pattern according to claim 1, wherein said step of post-baking comprises the steps of:
    peeling off said overlying layer material by washing with water after exposing said overlying layer material to light beams; and
    post-baking said resist;
    wherein said step of forming a resist pattern develops said resist using a predetermined developing solution.

4. The method for forming a resist pattern according to claim 1, wherein said overlying layer material comprises an acrylic polymer or a vinyl polymer as the components forming a water-soluble film by alone or in combination of two or more components.

5. The method for forming a resist pattern according to claim 1, wherein the acid substance contained in said overlying layer material is an ammonium salt of a sulfonic acid.

6. The method for forming a resist pattern according to claim 1, wherein the water-soluble photo base generator contained in said overlying layer material is a transition metal complex, a benzyl carbamate compound, or an oxime compound.

7. The method for forming a resist pattern according to claim 1, wherein said resist is a positive resist.

8. The method for forming a resist pattern according to claim 1, wherein said resist is a negative resist.

9. A method of manufacturing a semiconductor device using a method for forming a resist pattern according to claim 1.

10. An article comprising an overlying layer material covering a resist layer, the overlying layer comprising a water-soluble acid substances and a water-soluble photo base generator.

11. The article according to claim 10, wherein said overlying layer material comprises an acrylic polymer or a vinyl polymer as the components forming a water-soluble film by alone or in combination of two or more components.

12. The article according to claim 10, wherein the acid substance contained in said overlying layer material is an ammonium salt of a sulfuric acid.

13. The article according to claim 10, wherein the water-soluble photo base generator contained in said overlying layer material is a transition metal complex, a benzyl carbamate compound, or an oxime compound.

* * * * *